US008614441B2

(12) United States Patent
Koo et al.

(10) Patent No.: US 8,614,441 B2
(45) Date of Patent: Dec. 24, 2013

(54) METHODS FOR FORMING BANKS AND ORGANIC THIN FILM TRANSISTORS COMPRISING SUCH BANKS (71) Applicant: Samsung Electronics Co., Ltd., Suwon-Si (KR)

(72) Inventors: Bon Won Koo, Gyeonggi-do (KR); Joon Yong Park, Gyeonggi-do (KR); Jung Seok Hahn, Gyeonggi-do (KR); Joo Young Kim, Gyeonggi-do (KR); Kook Min Han, Gyeonggi-do (KR); Sang Yoon Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 13/904,512

(22) Filed: May 29, 2013

(65) Prior Publication Data

US 2013/0256643 A1 Oct. 3, 2013

Related U.S. Application Data (62) Division of application No. 13/355,940, filed on Jan. 23, 2012, now Pat. No. 8,476,103, which is a division of application No. 11/633,006, filed on Dec. 4, 2006, now Pat. No. 8,323,875.

(30) Foreign Application Priority Data

Feb. 17, 2006 (KR) .................. 10-2006-0015715

(51) Int. Cl.
H01L 29/08 (2006.01)
(52) U.S. Cl.
USPC .................................... 257/40; 257/E51.022

(58) Field of Classification Search
USPC ............ 257/40, E51.013, E51.017, E51.022; 438/82

See application file for complete search history.

(56) References Cited

U.S. PATENT DOCUMENTS 5,658,706 A 8/1997 Niki et al.
6,232,157 B1 5/2001 Dodabalapur et al.
(Continued)

FOREIGN PATENT DOCUMENTS

JP 2002-080547 3/2002
JP 2003-518332 6/2003
(Continued)

OTHER PUBLICATIONS

Marcus Halik et al. "High-Mobility Organic Thin-Film Transistors Based on $\alpha,\alpha'$- didecyloligothiophenes". Journal of Applied Physics, vol. 93, No. 5, Mar. 1, 2003, pp. 2977-2981.

(Continued)

Primary Examiner — Brook Kebede
(74) Attorney, Agent, or Firm — Harness, Dickey & Pierce (57) ABSTRACT Disclosed is a method for forming banks during the fabrication of electronic devices incorporating an organic semiconductor material that includes preparing an aqueous coating composition having at least a water-soluble polymer, a UV curing agent and a water-soluble fluorine compound. This coating composition is applied to a substrate, exposed using UV radiation and then developed using an aqueous developing composition to form the bank pattern. Because the coating composition can be developed using an aqueous composition rather than an organic solvent or solvent system, the method tends to preserve the integrity of other organic structures present on the substrate. Further, the incorporation of the fluorine compound in the aqueous solution provides a degree of control over the contact angles exhibited on the surface of the bank pattern and thereby can avoid or reduce subsequent surface treatments.

15 Claims, 3 Drawing Sheets

(56) References Cited

U.S. PATENT DOCUMENTS

| | | |
|---|---|---|
| 6,610,465 B2 | 8/2003 | Rahman et al. |
| 6,635,508 B2 | 10/2003 | Arai et al. |
| 6,740,900 B2 | 5/2004 | Hirai |
| 6,821,811 B2 | 11/2004 | Hirakata et al. |
| 6,949,762 B2 | 9/2005 | Ong et al. |
| 7,176,040 B2 | 2/2007 | Sirringhaus et al. |
| 7,368,009 B2 | 5/2008 | Okada et al. |
| 7,462,726 B2 | 12/2008 | Nakamura |
| 7,994,071 B2 | 8/2011 | Koo et al. |
| 2003/0059987 A1 | 3/2003 | Sirringhaus et al. |
| 2003/0096195 A1 | 5/2003 | Rolfson |
| 2004/0054044 A1 | 3/2004 | Bittner et al. |
| 2004/0185372 A1 | 9/2004 | Takakuwa |
| 2004/0247814 A1 | 12/2004 | Sirringhaus et al. |
| 2005/0127355 A1 | 6/2005 | Jeong et al. |
| 2005/0153239 A1 | 7/2005 | Hoshi et al. |
| 2006/0006380 A1 | 1/2006 | Shin et al. |
| 2006/0127681 A1 | 6/2006 | Domes et al. |
| 2006/0131267 A1 | 6/2006 | Lee et al. |
| 2007/0184366 A1 | 8/2007 | Takakuwa |

FOREIGN PATENT DOCUMENTS

| | | |
|---|---|---|
| KR | 10-2004-0028010 | 4/2004 |
| WO | WO 01/46987 | 6/2001 |
| WO | WO 2004/055920 | 7/2004 |

OTHER PUBLICATIONS

Fang-Chung Chen et al. "Organic Thin-Film Transistors with Nanocomposite Dielelectric Gate Insulator". Applied Physics Letters, vol. 85, No. 15, Oct. 11, 2004, pp. 3295-3297.

Notice of Allowance mailed Mar. 24, 2011 in U.S. Appl. No. 11/633,008.

U.S. Office Action dated Sep. 5, 2012 for related U.S. Appl. No. 13/355,940.

Korean Office Action dated Jan. 20, 2012 in counterpart Korean Application No. 10-2006-0015715.

METHODS FOR FORMING BANKS AND ORGANIC THIN FILM TRANSISTORS COMPRISING SUCH BANKS

PRIORITY STATEMENT

This non-provisional application is a divisional application of U.S. application Ser. No. 13/355,940, filed on Jan. 23, 2012 and now allowed, which is a divisional application of U.S. application Ser. No. 11/633,006, filed on Dec. 4, 2006, now U.S. Pat. No. 8,323,875, which claims priority under 35 U.S.C. §119 from Korean Patent Application No. 2006-15715, which was filed on Feb. 17, 2006, the entire contents of each of which are herein incorporated by reference.

BACKGROUND OF EXAMPLE EMBODIMENTS

1. Field of Endeavor

Example embodiments relate to methods for forming banks for retaining liquids and other flowable materials and organic thin film transistors including such banks. More specifically, example embodiments relate to methods for forming banks during the fabrication of organic electronic devices by utilizing a printing technique wherein a mixture of a water-soluble polymer containing a UV curing agent and a water-soluble fluorine compound is used to perform the formation and surface treatment of banks substantially simultaneously, and organic thin film transistors comprising such banks.

2. Description of Related Art

In recent years, a variety of polymeric materials have been investigated for their potential as novel electrical and electronic materials suitable for a wide variety of applications, e.g., functional electronic and optical devices. Polymeric materials may provide one or more advantages over previous materials including, for example, the relative ease with which they can be molded into fibers and films, improved flexibility, increased conductivity and reduced production costs. Research relating to electrically conductive polymers and their use in fabricating semiconductor active regions for organic thin film transistors has been ongoing for at least about 25 years.

Organic thin film transistors can be fabricated using relatively simple processes, such as printing, at relatively low cost. In addition, advantages associated with organic thin film transistors include relatively simple processes and their generally good compatibility with flexible substrates. In light of these advantages, a number of studies on organic thin film transistors are now ongoing around the world. Indeed, it is anticipated that organic thin film transistors will be particularly be useful in fabricating driving devices for active displays and in fabricating plastic chips that may, in turn, be incorporated into smart cards and/or inventory tags, for example RFID products.

However, the use of liquid or other flowable materials for forming and/or filling thin film patterns during the fabrication of organic electronic devices, such as display devices (e.g., electroluminescence (EL) devices and light-emitting diodes (LEDs)), in combination with conventional printing techniques can result in containment failures. For example, the liquid material(s) may overflow the bank and spread into the pixel regions of adjacent organic electronic devices, thereby degrading the properties of the affected electronic devices. For example, when a photoresist composition is used to form banks using an organic solvent in the fabrication of a bottom contact type or top gate type organic thin film transistor, overflow of the organic solvent can compromise the dielectric performance of adjacent organic insulating films, thereby potentially degrading the performance of the resulting organic thin film transistor.

As used herein, the term "bank" should be understood as referring to retaining structures, isolation structures, dams or partition members, i.e., structures configured to divide adjacent regions and suppress or prevent cross-talk between adjacent devices and/or to define enclosed regions that can subsequently be filled with a liquid or other flowable composition, for example, a suitable ink, to define discrete functional zones or regions on the surface of the device and improve the uniformity of the resulting device structure(s).

Many methods have been utilized in efforts to address the processing issues associated with the conventional formation and utilization of such banks. One such effort resulted in a method for forming banks comprising forming a polyimide layer, forming a photoresist layer on the polyimide layer, baking the layers, exposing the baked layers to a pattern of UV radiation during a photolithographic exposure process, developing the exposed photoresist layer to from a photoresist pattern and etching the exposed regions of the polyimide layer. This method also provided for post-etch surface treatment of the banks to alter the contact angle between the banks and the substrate on which they were formed. Another effort resulted in a method for forming banks comprising the steps of forming a layer of a polymer compound on a substrate, stamping the polymer layer, and baking the stamped layer. This method also provided for a surface treatment of the banks with plasma to modify the initial structure.

These conventional methods, however, remain generally unsuited for fabrication processes that include bottom gate type insulating films, which are general structures of display arrays that are, in turn, used to fabricate organic devices. In the fabrication of such devices, the organic devices are exposed to organic solvents and may be degraded as a result of this exposure. In particular, the solvent(s) and/or solvent systems present in the compositions utilized for forming the banks, for example, the photoresist solvent(s), developing solvents and photoresist stripping compositions can degrade the underlying and/or previously patterned organic materials which, in turn, can degrade the yield, performance and/or reliability of the resulting devices.

SUMMARY OF EXAMPLE EMBODIMENTS

The example embodiments, therefore, have been devised in light of the deficiencies and compromises associated with the conventional methods for fabricating such banks and the devices that incorporate such banks. Example embodiments, for example, include methods example embodiments for forming banks during the fabrication of organic electronic devices utilizing a printing technique that suppresses or eliminates adverse effects in adjacent organic electronic devices, for example, the pixel regions of adjacent devices and/or structural modules. Accordingly, methods according to example embodiments provide for the fabrication of banks sufficient to suppress or eliminate degradation of adjacent regions while still providing a degree of control with respect to the relative hydrophilicity of channel regions and/or other selected regions, thereby suppressing or preventing organic solvents from overflowing the banks.

Example embodiments also include methods for fabricating organic thin film transistor devices, for example, display drivers and/or display devices, that incorporate banks formed using one or more methods according to example embodiments for fabricating banks sufficient to suppress or eliminate degradation of adjacent regions and to provide a degree of control of the relative hydrophilicity of channel regions and/or other selected regions to improve containment of organic solvents within the banks. Example embodiments also include electronic display devices incorporating one or more such display devices that, in turn, incorporate banks formed using one or more methods according to example embodiments for fabricating banks capable of suppressing or eliminating degradation of adjacent regions by providing a degree of control of the relative hydrophilicity of channel regions and/or other active regions.

One method in accord with example embodiments for achieving the desired improvement in the performance of the banks includes fabricating an organic electronic device using a printing technique employing a mixture of a water-soluble polymer containing a UV curing agent and a water-soluble fluorine compound for achieving formation and surface treatment of banks in a substantially simultaneous fashion.

BRIEF DESCRIPTION OF THE DRAWINGS

The features, elements and steps according to example embodiments will be more clearly understood from the following detailed description when considered in light of the accompanying drawings, in which.

It should be noted that these Figures are intended to illustrate the general characteristics of methods and materials of certain example embodiments and to supplement the written description provided below. These drawings are not, however, to scale and may not precisely reflect the precise structural characteristics of any given embodiment, and should not be interpreted as defining or limiting the range of values or properties encompassed by example embodiments. In particular, the relative thicknesses and positioning of layers or regions may be reduced or exaggerated for clarity. The use of similar or identical reference numbers in the various drawings is intended to indicate the presence of a similar or identical element or feature.

DESCRIPTION OF EXAMPLE EMBODIMENTS

Figure 1:
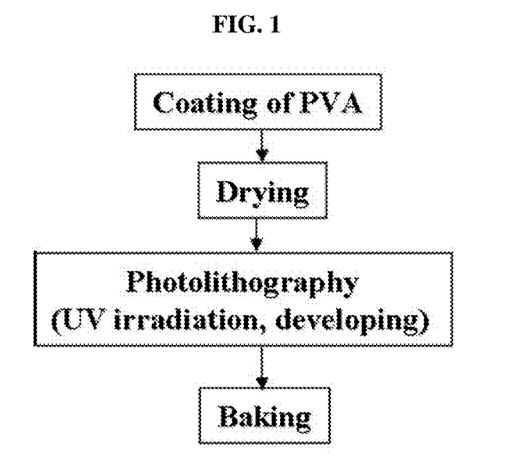
FIG. 1 is a process chart providing a schematic illustration of an example embodiment of a method for forming banks.

Example embodiments will now be described in detail with reference to the accompanying drawings. Example embodiments provide methods for forming banks comprising the steps of (1) coating a substrate with a water-soluble polymer solution containing a UV curing agent and a water-soluble fluorine compound, and (2) irradiating the coated water-soluble polymer solution with UV light by a photolithographic patterning process, followed by a suitable developing to form a pattern of banks on the substrate surface. FIG. 1 is a process chart schematically illustrating a method for forming banks according to one embodiment of example embodiments.

The water-soluble polymer used in the method of example embodiments has a functional group with a high affinity for water, for example, one or more groups selected from a group including —OH, —COOH, —NH$_2$ and —CONH$_2$, within the molecular structure and includes little or no crosslinking so that it dissolves easily in water to from an aqueous solution. The use of the water-soluble polymer solves the problem of degraded performance of organic electronic devices, which is caused by a deterioration of pixel regions of adjacent organic electronic devices induced when a photoresist is used to form banks using a conventional organic solvent, and enables the formation of banks without adversely affecting pixel regions of organic electronic devices.

Suitable water-soluble polymers that may be used in a method according to example embodiments include polyvinyl alcohol, polyvinyl chloride, polyacryl amide, polyethylene glycol, polyethylene oxide, polymethyl vinyl ether, polyethylene imine, polyphenylene vinylene, polyaniline and polypyrrole as well as copolymers, block copolymers, and mixtures thereof. The water-soluble polymer may be further polymerized with one or more monomers, oligomers or polymers that do not include a corresponding hydrophilic functional group, thereby rendering them insoluble or only slightly soluble in water, to form copolymers, terpolymers and even higher order polymers. The water-soluble polymer component of the final polymer composition, however, should be sufficient to maintain suitable solubility in water, typically at least 10% by weight of the water-soluble polymer.

The UV curing agent used in the example embodiments facilitates curing of banks by UV irradiation. Examples of suitable UV curing agents include ammonium dichromate, pentaerythritol triacrylate, urethane acrylate, and mixtures thereof. The UV curing agent may be incorporated in the aqueous solution of the water-soluble polymer in deionized water in a quantity sufficient to establish a ratio between the UV curing agent and the water-soluble polymer in the range of 1:100 to 1:20, and more typically, a range of 1:50 to 1:25, based on the total solids (dry) content of the composition.

The coating composition may be applied to the substrate surface using any appropriate technique, for example, spin coating, dip coating, printing, ink-jet printing, or roll coating, suitable for forming a coating layer of sufficient thickness and uniformity. After application, the solvent content of the coating composition may be reduced by a conventional baking or drying method sufficient to produce a coating layer including an increased concentration of the polymer(s) and UV-curing agent(s) and thereby improve the stability of the coating layer before patterning the coating layer.

The UV irradiation may be performed using a lamp or other light source capable of applying light energy of, for example, 300 to 500 W per square centimeter, to the coating layer at a UV wavelength of, for example, 340 to 400 nm for an exposure period of, for example, 10 to 180 seconds to from an exposed coating layer. The exposed coating layer may then be developed using deionized water at room temperature, approximately 25° C. for a development period, for example, 1 to 5 minutes, suitable to remove portions of the coating layer, leaving a pattern of banks on the substrate surface.

The method according to example embodiments may further comprise the step of baking the pattern of banks after the developing portion has been completed. The baking process may be performed on a hot plate at a bake temperature of, for example, 50 to 200° C. for a bake period of, for example, 0.5 to 2 hours, to complete formation of the banks.

As noted above, in addition to the water-soluble polymer and the UV curing agent, example embodiments of the coating composition also include at least one water-soluble fluorine compound. The inclusion of the water-soluble fluorine compound allows for the substantially simultaneous formation and surface treatment of banks, thereby avoiding or reducing the need for additional processing, for example, subsequent surface treatment(s) used for establishing a desired contact angle with the banks after formation of the banks.

The water-soluble fluorine compound(s) incorporated in the coating composition according to example embodiments modifies the hydrophilicity of the resulting banks relative to adjacent regions of the substrate, for example, a channel and thereby achieve, for example, an increased contact angle. The ratio of the water-soluble fluorine compound(s) to the water-soluble polymer(s) will typically fall within a range of 1:10 to 1:1, based on the total solids (dry) content of the coating composition. Examples of suitable water-soluble fluorine compounds example embodiments include those compounds that are stable in aqueous solutions, for example, fluoroalkanes, and may include one or more silanol groups.

Other example embodiments include organic thin film transistors comprising a substrate, a gate electrode, a gate insulating film, source/drain electrodes, an organic semiconductor layer, and banks formed using a method corresponding to example embodiments detailed above. There is no particular restriction regarding the structure of the organic thin film transistors which may include, for example, one or more structures generally categorized as bottom contact type, top contact type and/or top gate type structures.

Figure 2:
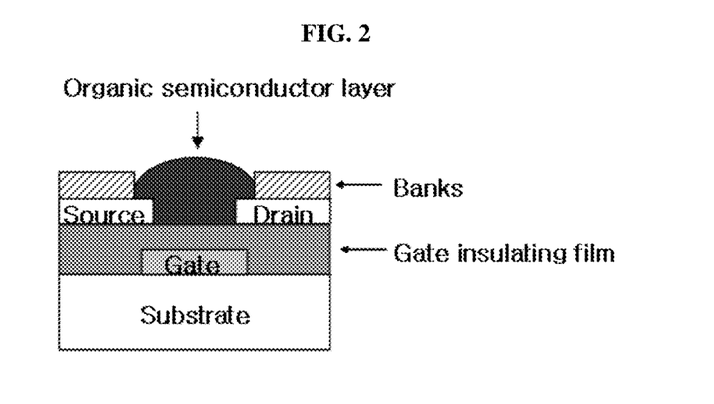
FIG. 2 is a cross-sectional view illustrating an example embodiment of an organic thin film transistor structure incorporating banks formed by an example embodiment of the disclosed bank formation methods.

Example organic thin film transistors incorporating banks formed using an example embodiment of the methods detailed above will be detailed with respect to both bottom contact type and top gate type organic thin film transistors as described with reference to the accompanying drawings. FIG. 2 illustrates an example embodiment of a bottom contact type organic thin film transistor. As shown in FIG. 2, the bottom contact type organic thin film transistor comprises a substrate, a gate electrode formed on a surface of the substrate, a gate insulating film formed thereon, source/drain electrodes formed on the gate insulating film, banks formed on the source/drain electrodes, and an organic semiconductor layer. In an alternative structure, a top gate type organic thin film transistor comprises a substrate, source/drain electrodes formed on the surface of the substrate, banks formed on the source/drain electrodes, an organic semiconductor layer, a gate insulating film formed on the organic semiconductor layer, and a gate electrode.

Those skilled in the art will appreciate that while the organic thin film transistors illustrated in example embodiments have a structure in which banks are formed on source/drain electrodes, methods according to example embodiments may be used to form banks on a wide variety of structures and is not, therefore, limited to the illustrated structures.

The gate insulating film incorporated in the organic thin film transistor according to example embodiments may be selected from a group including, for example, polyvinyl phenol, polymethyl methacrylate, polyacrylate, polyvinyl alcohol, $SiN_x$ ($0<x<4$), $SiO_2$, $Al_2O_3$, and mixtures and derivatives thereof. The organic semiconductor layer may include one or more organic semiconducting materials, for example, polythiophene, polyaniline, polyacetylene, polypyrrole, polyphenylene vinylene, and mixtures and derivatives thereof. The gate electrode, the source electrode and the drain electrode may be formed from any suitable conductor including, for example, metal-based conductors including metals, for example, gold (Au), silver (Ag), aluminum (Al), nickel (Ni), molybdenum (Mo), tungsten (W), metal oxides, for example, indium-tin oxide (ITO) and/or indium-zinc oxide (IZO), metal nitrides, metal alloys and mixtures thereof, as well as organic conductors, for example, polythiophene, polyaniline, polyacetylene, polypyrrole, polyphenylene vinylene, polyethylenedioxythiophene (PEDOT)/polystyrenesulfonate (PSS) mixtures, and combinations and mixtures thereof. The substrate may be formed from any suitable material, typically an insulating or semiconducting material, for example, glass, silicon, and plastic, and may include combinations and mixtures thereof, but is not limited to these materials.

A bottom contact type organic thin film transistor may be fabricated in accord with an example embodiment of the disclosed method by (1) forming a gate electrode on a substrate; (2) forming a gate insulating film on the gate electrode; (3) forming source/drain electrodes on the gate insulating film; (4) forming banks on the source/drain electrodes; and (5) forming an organic semiconductor layer on the gate insulating film and the source/drain electrodes.

Alternatively, a top gate type organic thin film transistor may be fabricated in accord with an example embodiment of the disclosed method by (1) forming source/drain electrodes on a substrate; (2) forming banks on the source/drain electrodes; (3) forming an organic semiconductor layer between the source/drain electrodes and the substrate; (4) forming a gate insulating film on the organic semiconductor layer; and (5) forming a gate electrode on the gate insulating film.

A more detailed description of the respective steps for fabricating the bottom contact type organic thin film transistor according to example embodiments is provided below. As will be appreciated by those skilled in the art, the description of the steps utilized in fabricating a bottom contact type organic thin film transistor according to example embodiments will be equally applicable to the corresponding steps utilized in fabricating a top gate type organic thin film transistor.

(1) Formation of Gate Electrode

First, a substrate is washed or otherwise prepared in a manner sufficient to remove impurities and contamination present thereon using any suitable or conventional method of substrate preparation. A single or multi-layer gate electrode film is then formed on the surface of the substrate and then patterned to obtain a gate electrode pattern.

(2) Formation of Gate Insulating Film

A gate insulating film of sufficient thickness, uniformity and dielectric strength is then formed on the gate electrode and the exposed regions of the substrate using any suitable or conventional process. As will be appreciated by those skilled in the art, a variety of processes may be utilized for forming the gate insulating film including, for example, vacuum evaporation and solution deposition. Depending on the materials and processes utilized, the gate insulating film may also be subjected to one or more thermal processes or "bakes" that may include, for example, a soft bake at a soft bake temperature range of about 60° C. to about 150° C. for bake period of about 1 minute to about 10 minutes, and/or a hard bake at a hard bake temperature of about 100° C. to about 200° C. for a bake period of about 30 minutes to about 3 hours.

(3) Formation of Source/Drain Electrodes

Source/drain electrodes may then be formed on the gate insulating layer. Specifically, one or more layers of a suitable conductor, for example a metal, metal nitride, metal oxide, metal alloy, organic conductor or combination thereof is deposited on the gate insulating film using any suitable or conventional thin film formation technique(s). This conductive thin film may then be patterned using any suitable or conventional photolithographic process with the exposed photoresist then being developed to protect those areas of the conductive film that are to become source and drain electrodes are formed and expose those regions of the film that will be removed to form the S/D pattern. The conductive thin film is then etched using the S/D photoresist pattern as an etch mask using an etching technique suitable for the conductive material(s) present in the conductive thin film. After completing the etch process(es), the photoresist pattern may be removed using a conventional photoresist stripping method to expose the source/drain electrodes on the gate insulating film.

Processes for the formation of the source and drain electrodes on the gate insulating film are not especially limited and may, for examples, utilize one or more methods selected from a group including vacuum evaporation, thermal evaporation, spin coating, roll coating, spray coating and printing.

(4) Formation of Banks

Banks are then formed on the source/drain electrodes utilizing a method corresponding to example embodiments described above in which an aqueous solution including at least a water-soluble polymer, a UV curing agent and a water-soluble fluorine compound is applied to the substrate surface and then patterned without the use of additional organic solvents. In example embodiments, a qualitative measure of the degree of cross-linking is whether it is soluble in the solvents such as toluene, tetrahydronaphthalene (THN), chlorobenzene, dichlorobenzene, trichlorobenzene, bromobenzene, cyclohexanone, methylnaphthalene, etc., used in the printing process including ink jetting.

(5) Formation of Organic Semiconductor Layer

An organic semiconductor layer is formed by applying one or more suitable organic semiconductor material(s) to the source/drain electrodes and the gate insulating film using any suitable or conventional coating process. Coating processes generally considered suitable for depositing such organic semiconductor material include, but are not limited to, thermal evaporation, screen printing, printing, spin coating, dip coating, and ink spraying.

Example embodiments also provide for the fabrication of display devices incorporating such organic thin film transistors. A variety of display devices may be manufactured in this manner including, for example, electroluminescence devices, liquid crystal devices and/or electrophoresis devices. Example embodiments also provide for electronic display devices incorporating such display device including, for example, displays, smart cards and inventory (RFID) tags.

Certain example embodiments are be explained in greater detail below with reference to the following examples. However, as will be appreciated by those skilled in the art, these examples are given for the purpose of illustration only and are not intended to, and should not be construed to, limit the scope of the appended claims.

EXAMPLES

Example 1

A glass substrate was cleaned, and aluminum (Al) was deposited thereon using a sputtering technique to form a gate electrode having a thickness of about 1,500 Å. An organic gate insulating film having a thickness of about 4,000 Å was then formed on the gate electrode by spin coating at 2,000 rpm, followed by sequential baking at 70° C. for 20 minutes and 200° C. for 2 hours. As will be appreciated by those skilled in the art, the viscosity of the organic insulating material and the operation of the spin coating apparatus may be modified to produce layers having different thickness ranges.

Next, a layer of gold (Au) was deposited on the insulating film to a thickness of 700 Å using a thermal evaporation method. This conductive layer was then subjected to a photolithographic process to form an appropriate etch mask and then etched to produce an electrode pattern. For this example, the deposition was conducted under a vacuum pressure of $2 \times 10^{-7}$ torr and achieved a deposition rate of about 0.85 Å/sec.

Subsequently, banks were formed on the electrodes in accordance with the following procedure. The coating composition was prepared by adding ammonium dichromate (Sigma Aldrich) to a 5 wt % solution of polyvinyl alcohol (#2000, Kanto Chemical Co.) in deionized water to prepare an intermediate solution. (Unless otherwise indicated, all weight percent (wt %) values are based on a "dry" weight) The ammonium dichromate was added to the polyvinyl alcohol at a ratio of 1:33, based on the solids content. A fluoroalkane (Zonyl DuPont®), specifically a fluorine compound that is stable in aqueous solutions was then added to the intermediate solution to produce an example coating composition. The ratio of the fluoroalkane to the water-soluble polymer in the coating composition was 0.3:1, based on the solids content. The resulting example coating composition, an aqueous polyvinyl alcohol solution, was then spin-coated on the substrate and the electrode pattern and dried to remove the majority of the solvent (water) and thereby form a coating layer. In example embodiments, a water-soluble fluorine compound is selected from a group consisting of fluoroalkanes and their derivatives, perfluoroalkylalcohol ethylene oxides and their derivatives, perfluoroalkylcarboxylic acids and their salts, perfluoroalkylsulfonic acids and their salts, perfluoroalkyloxybenzenesulfonic acids and their salts, perfluoroalkylbenzenesulfonic acids and their salts, perfluoroalkyl amine and their salts, perfluoroalkylsulfonamides and their salts, ammonium fluoride, monoethanolamine fluoride, tetramethylammonium fluoride, mixtures and combinations thereof.

The surface of those portions of the coating layer that will become banks was then irradiated using a UV lamp with a power of about 400 W/cm$^2$ at a wavelength of 370 nm for an exposure time of 180 seconds. The exposed coating layer, including the irradiated bank portions, was then developed using deionized water at room temperature for a development period of 3 minutes to produce a bank pattern. The developed bank pattern was then baked on a hot plate at a bake temperature of 200° C. for a bake time of one hour. After cooling the bank pattern, an organic semiconductor material, specifically polythiophene, was then applied to form a semiconductor active region on those portions of the electrodes and the gate insulating film exposed between the electrodes that are surrounded by a portion of the bank pattern. In this instance, the organic semiconductor material was applied using an ink spraying method to form the semiconductor active layer.

Experimental Example 1

Figure 3A:
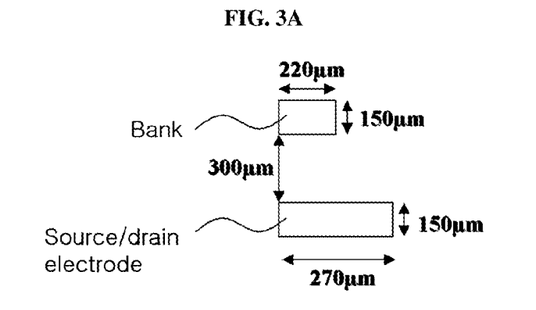
FIGS. 3A and 3B are cross-sectional views illustrating the patterning performance according to an example embodiment in reproducing the photomask sizing of FIG. 3A in the bank and source/drain electrode structures FIG. 3B of an organic thin film transistor incorporating banks formed by a method according to an example embodiment, respectively.
Figure 3B:
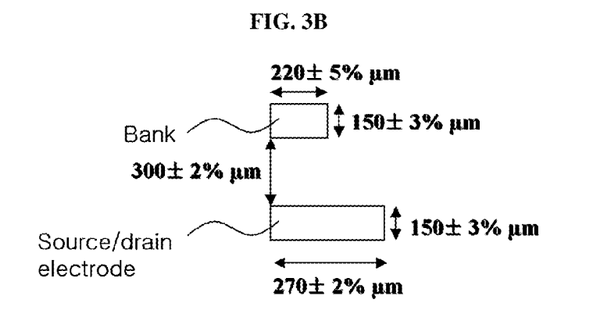

In order to evaluate the patternability of banks formed in a manner according to the example embodiments, the size of a pattern of a photomask used and that of corresponding portions of the banks formed using that photomask as detailed in Example 1 were measured using a confocal laser scanning microscope (OLYMPUS LEXT OLS3000). The results are shown in FIGS. 3A and 3B, wherein FIG. 3A shows the size of the bank and source/drain patterns of a photomask used, and FIG. 3B shows the size of the corresponding banks and source/drain structures formed using the photomask. As reflected in the close agreement between the photomask measurements and the resulting pattern measurements, the method of forming banks according to example embodiments can accurately reproduce the corresponding mask feature.

Figure 4:
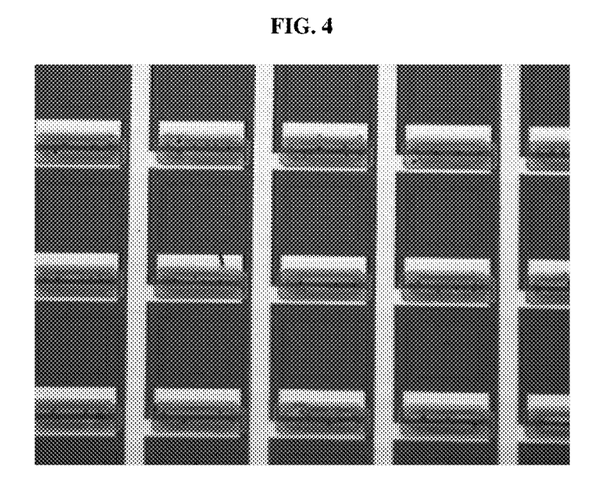
FIG. 4 is a photograph illustrating the external shape of example embodiments of organic thin film transistors incorporating banks formed by a method according to an example embodiment of the disclosed methods.

FIG. 4 shows a semiconductor array produced by depositing the semiconductor material by ink spraying after formation of the banks.

Experimental Example 2

Figure 5A:
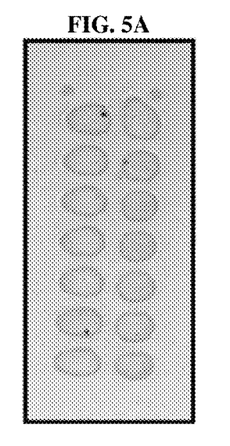
FIG. 5A is an example embodiment of an ink-jet profile corresponding to example embodiments of organic thin film transistors incorporating banks formed by a method according to an example embodiment of the disclosed methods.
Figure 5B:
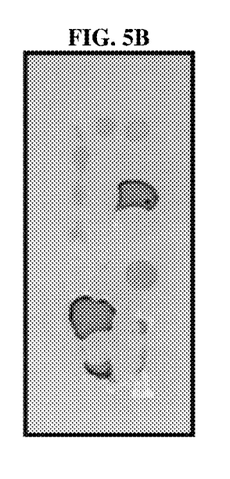
FIG. 5B is an example embodiment of an ink-jet profile corresponding to organic thin film transistors that do not incorporate a bank according to any example embodiments.

In order to demonstrate and evaluate the use of printing methods in fabricating organic thin film transistors incorporating banks, the ink-jet profile of the organic thin film transistors fabricated in Example 1 was observed under an optical microscope. The results are shown in FIGS. 5A and 5B wherein FIG. 5A shows the ink-jet profile of organic thin film transistors that did incorporate banks according to example embodiments and FIG. 5B shows a corresponding ink-jet profile of organic thin film transistors that did not incorporate banks according to example embodiments. As reflected in the micrographs, those organic thin film transistors that did not incorporate banks manufactured according to example embodiments exhibited relatively non-uniform spreadability while, conversely, those organic thin film transistors that did incorporate banks manufactured according to example embodiments comprising banks showed markedly more uniform spreadability.

Experimental Example 3

In order to evaluate whether organic thin film transistors according to example embodiments alter the contact angles, the channel contact angles for the surface of the gate insulating film and the surface of the banks as fabricated in Example 1 were measured with the results provided below in TABLE 1.

The contact angles were determined by advancing angle measurement using a single drop of distilled water.

TABLE 1

| | Example 1 |
|---|---|
| Channel | 2.7° |
| Banks | 58.6° |

As can be seen from the data provided in TABLE 1, the addition of the water-soluble fluorine compound to the coating composition used to form the banks incorporated in the organic thin film transistors according to example embodiments altered the hydrophilicity of the banks relative to that of a corresponding channel, thereby increasing the contact angle.

Although certain example embodiments have been described herein with reference to particular materials and structures, these example embodiments are not intended to, and should not be considered to, unduly limit the scope of the embodiments encompassed by the disclosure. Accordingly, those skilled in the art example embodiments will appreciate that various modifications of the structures, materials and processes are possible, without departing from the scope of the disclosure defined by example embodiments.

As apparent from the foregoing, organic thin film transistors utilizing banks formed by a method according to example embodiments, which includes the use of a water-soluble polymer, may improve the yield, performance and/or reliability of the resulting devices. In addition, using a coating composition including both a water-soluble polymer and a water-soluble fluorine compound provides for the substantially simultaneous formation and surface treatment of the resulting banks, thereby simplifying the fabrication process. Furthermore, the inclusion of the water-soluble fluorine compound alters the hydrophilicity of the banks relative to that of the corresponding channel surfaces, thereby providing improved control of the respective contact angles exhibited by these surfaces.

What is claimed is:

1. An organic thin film transistor, comprising:
a gate electrode;
a source electrode;
a drain electrode;
an organic semiconductor; and
a bank structure surrounding and containing the organic semiconductor, wherein the bank structure includes a quantity of an water-soluble fluorine compound sufficient to produce a contact angle greater than a target value.

2. The organic thin film transistor of claim 1, wherein the bank structure is on the source electrode and the drain electrode.

3. The organic thin film transistor of claim 1, wherein the water-soluble fluorine compound is a fluoroalkane containing a silanol group.

4. The organic thin film transistor of claim 1, wherein the water-soluble fluorine compound is selected from a group consisting of fluoroalkanes and derivatives thereof, perfluoroalkylalcohol ethylene oxides and derivatives thereof, perfluoroalkylcarboxylic acids and salts thereof, perfluoroalkylsulfonic acids and salts thereof, perfluoroalkyloxybenzenesulfonic acids and salts thereof, perfluoroalkylbenzenesulfonic acids and salts thereof, perfluoroalkyl amine and salts thereof, perfluoroalkylsulfonamides and salts thereof, ammonium fluoride, monoethanolamine fluoride, tetramethylammonium fluoride, mixtures and combinations thereof.

5. The organic thin film transistor of claim 1, further comprising:
a gate insulating film interposed between the gate electrode and the organic semiconductor,
wherein the gate insulating film is made of a material selected from a group consisting of polyvinyl phenol, polymethyl methacrylate, polyacrylate, polyvinyl alcohol, silicon oxynitride, $SiN_x$, wherein $0<x<4$, $SiO_2$, $Al_2O_3$, and mixtures thereof, and combinations thereof.

6. The organic thin film transistor of claim 5, further comprising:
a substrate having exposed regions covered by the gate insulating film,
wherein the substrate is made of at least one material selected from a group consisting of glass, silicon, plastic and combinations thereof.

7. The organic thin film transistor of claim 5, wherein the target value is a contact angle exhibited by a surface of the gate insulating film, and
the surface of the gate insulating film corresponds to a channel region of the organic thin film transistor.

8. The organic thin film transistor of claim 1, wherein the organic semiconductor is made of at least one material selected from a group consisting of polythiophene, polyaniline, polyacetylene, polypyrrole, polyphenylene vinylene, combinations thereof, mixtures and derivatives thereof.

9. The organic thin film transistor of claim 1, wherein the gate electrode, the source electrode and the drain electrode each include a conductor selected from a group consisting of gold (Au), silver (Ag), aluminum (Al), nickel (Ni), molybdenum (Mo), tungsten (W), indiumtin oxide (ITO), indiumzinc oxide (IZO), metal nitrides, polythiophene, polyaniline, polyacetylene, polypyrrole, polyphenylene vinylene, and polyethylenedioxythiophene (PEDOT)/polystyrenesulfonate (PSS) mixtures, polyethylenedioxythiophene (PEDOT)/polystyrenesulfonate (PSS) combinations, alloys thereof and mixtures thereof.

10. The organic thin film transistor of claim 1, wherein the bank structure further includes a water-soluble polymer, and
the water-soluble polymer is at least one selected from polyvinyl alcohol, polyvinyl chloride, polyacryl amide, polyethylene glycol, polyethylene oxide, polymethyl vinyl ether, polyethylene imine, polyphenylene vinylene, polyaniline, polypyrrole, copolymers, block copolymers, and mixtures thereof.

11. The organic thin film transistor of claim 10, wherein a water-soluble polymer component of the water-soluble polymer is at least 10% by weight of the water-soluble polymer.

12. The organic thin film transistor of claim 1, wherein the bank structure is configured to enclose an active region of the organic thin film transistor, and
the active region being fillable with a liquid or a flowable composition.

13. The organic thin film transistor of claim 12, wherein the active region corresponds to a channel region of the organic thin film transistor.

14. The organic thin film transistor of claim 1, wherein the contact angle is exhibited by a surface of the bank structure.

15. The organic thin film transistor of claim 1, wherein the bank structure includes a plurality of bank patterns each respectively on either the source electrode or the drain electrode.

* * * * *